(12) United States Patent
Chen

(10) Patent No.: US 7,722,217 B2
(45) Date of Patent: May 25, 2010

(54) LIGHT-EMITTING DIODE CLUSTER LAMP

(75) Inventor: Jen-Shyan Chen, Hsinchu (TW)

(73) Assignee: Neobulb Technologies, Inc. (BN)

( * ) Notice: Subject to any disclaimer, the term of this patent is extended or adjusted under 35 U.S.C. 154(b) by 34 days.

(21) Appl. No.: 11/921,177

(22) PCT Filed: May 18, 2006

(86) PCT No.: PCT/CN2006/001023

§ 371 (c)(1),
(2), (4) Date: Nov. 28, 2007

(87) PCT Pub. No.: WO2006/125375

PCT Pub. Date: Nov. 30, 2006

(65) Prior Publication Data

US 2008/0247162 A1 Oct. 9, 2008

(30) Foreign Application Priority Data

May 25, 2005 (CN) .................... 2005 1 0073867

(51) Int. Cl.
*F21V 4/00* (2006.01)

(52) U.S. Cl. ..................... 362/249.02; 362/249.01; 362/294

(58) Field of Classification Search ............ 362/294, 362/373, 249, 227, 240, 545, 547, 800, 249.01, 362/249.02
See application file for complete search history.

(56) References Cited

U.S. PATENT DOCUMENTS 6,897,486 B2* 5/2005 Loh ........................ 257/81

6,910,794 B2* 6/2005 Rice ........................ 362/547
7,204,607 B2* 4/2007 Yano et al. ................. 362/231
7,438,448 B2* 10/2008 Chen ........................ 362/373
2003/0227774 A1* 12/2003 Martin et al. ............... 362/240
2005/0279949 A1* 12/2005 Oldham et al. ............. 250/458.1

FOREIGN PATENT DOCUMENTS

CN 1680749 A 10/2004
JP 2005/093097 A 9/2003

OTHER PUBLICATIONS

International Search Report of PCT/CN2006/001023 mailed Sep. 7, 2006.

* cited by examiner

*Primary Examiner*—Hargobind S Sawhney
(74) *Attorney, Agent, or Firm*—Thomas, Kayden, Horstemeyer & Risley, LLP

(57) ABSTRACT

The invention relates to a light-emitting diode cluster lamp. The light-emitting diode cluster lamp includes a plurality of light-emitting diode lamp packages, a control circuit, and a casing. Each of the light-emitting diode lamp packages includes a heat-conducting-and-dissipating module and a light-emitting diode module. The control circuit module is used for controlling the light-emitting diode lamp packages. The casing is adapted to accommodate the light-emitting diode lamp packages and the control circuit module. When the light-emitting diode cluster lamp is connected to a power source, the control circuit module selectively makes the light-emitting diode modules emit light. The heat generated during the light emission of each of the light-emitting diode modules is conducted and dissipated by the corresponding heat-conducting-and-dissipating module of each of the light-emitting diode modules.

13 Claims, 7 Drawing Sheets

LIGHT-EMITTING DIODE CLUSTER LAMP

BACKGROUND OF THE INVENTION

1. Field of the Invention

The present invention relates to a light-emitting diode cluster lamp; in particular, the light-emitting diode cluster lamp, according to the invention, is a lighting device with high intensity.

2. Description of the Prior Art

Because light-emitting diodes have many advantages, including power-saving, shake-resistant, rapidly-responding, and applicable to mass production, the current lighting products applying the light-emitting diodes as the light source are becoming more widely used. However, after continuous light emission of a high power light-emitting diode for a period of time, the problem of overheating arises, causing the light-emitting efficiency of the light-emitting diode to drop and the brightness of the light-emitting diode not being able to increase. Thus, different types of products applying high power light-emitting diodes all require a good heat-dissipating mechanism.

Referring to FIG. 1A and FIG. 1B, FIG. 1A is an outside perspective view of a lighting device of an integrated heat-dissipating apparatus according to prior art. FIG. 1B is a sectional view of the lighting device of the integrated heat-dissipating apparatus according to prior art. In order to increase the light intensity provided by a single lighting device, a plurality of light-emitting diodes 22 shown in the figures are disposed on a control circuit 24. The control circuit 24 is used for controlling the light-emitting diodes 22. The heat-conducting plate 26 beneath the control circuit 24 is used for assisting the light-emitting diodes 22 and the control circuit 24 to dissipate heat. A plurality of heat-dissipating fins 28 are mounted on a circumference of the heat-conducting plate 26. The disadvantage of the lighting device, according to the lighting device shown in FIG. 1A and FIG. 1B, is that the control circuit 24 is too close to the light-emitting diodes 22. When the light-emitting diodes 22 generate heat energy, the operation of the control circuit 24 can be easily affected and even become disrupted.

Accordingly, a scope of the present invention is to provide a light-emitting diode cluster lamp to provide a lighting effect with high intensity, in addition to resolving the aforementioned heat-dissipating problems found in prior art.

SUMMARY OF THE INVENTION

A scope of the invention is to provide a light-emitting diode cluster lamp. The light-emitting diode cluster lamp, according to the invention, includes a plurality of light-emitting diode lamp packages, a control circuit module, and a casing.

Each of the light-emitting diode lamp packages includes a heat-conducting-and-dissipating module and a light-emitting diode module. The heat conducting-and-dissipating module includes a heat-conducting device and at least one heat-dissipating fin which has a flat portion. The at least one heat-dissipating fin is mounted on a circumference of the heat-conducting device. The light-emitting module is disposed on the flat portion of the heat-conducting device and attached flatly and seamlessly to the flat portion. The light-emitting diode module packs many light-emitting diodes or laser diodes together, so that each of the light-emitting diode lamp packages can provide a lighting effect comparative to that of a point source. The control circuit module is used for controlling the light-emitting diode lamp packages. The casing is adapted to accommodate the light-emitting diode lamp packages and the control circuit module.

When the light-emitting diode cluster lamp is connected to a power source, the control circuit module controls the light-emitting diode modules and selectively makes the light-emitting diode modules emit lights. Furthermore, the heat generated during light emission of one of the light-emitting diode modules is conducted from the flat portion of the heat-conducting device corresponding to the light-emitting diode module to the at least one heat-dissipating fin, and then it is dissipated by the at least one heat-dissipating fin.

The light-emitting diode cluster lamp, according to the invention, integrates the heat-conducting/emitting module with the light-emitting diode module. The heat-conducting-and-dissipating module is capable of dissipating the heat energy generated by the light-emitting diode module immediately to the surrounding air by using each of the at least one heat-dissipating fin, substantially increasing the heat-dissipating efficiency. Therefore, in comparison with prior art, the light-emitting diode cluster lamp, according to the invention, is more suitable for applications in lighting devices requiring highly efficient light-emitting diodes. Furthermore, the light-emitting diode cluster lamp, according to the invention, integrates many light-emitting diode lamp packages to be comparative to a point source; thus, it is capable of providing lighting with high intensity.

The light-emitting diode cluster lamp, according to the invention, can integrate a wide array of diode lamps of the current lighting devices. The casing can be designed to match the sizes of the current cylindrical or cubical batteries. Thus, the diode lamp, according to the invention, can be easily integrated with the current power source devices.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
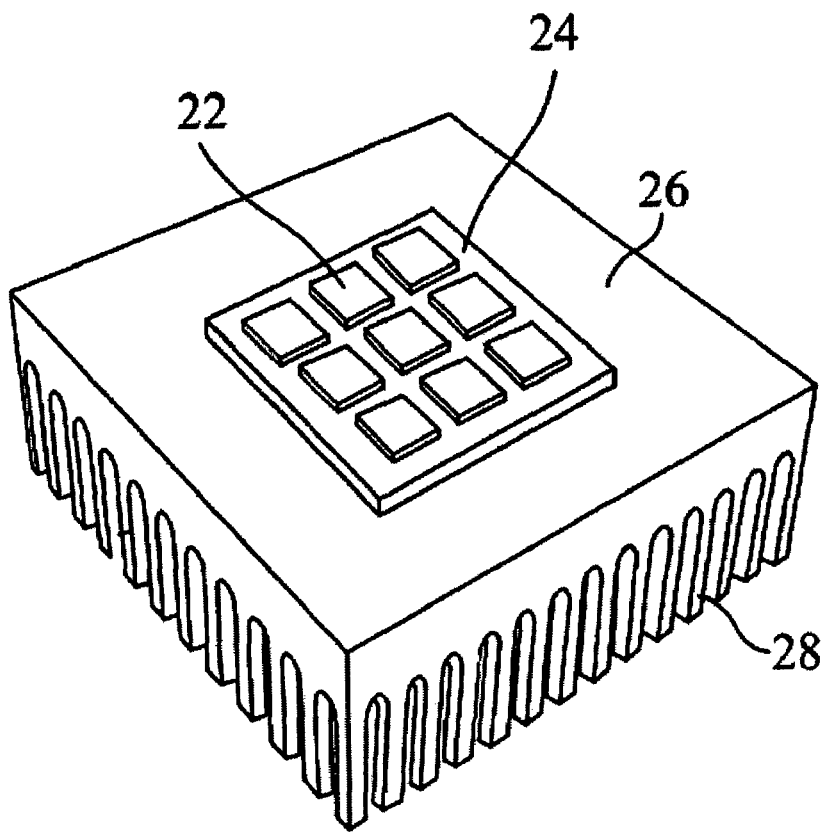
FIG. 1A is an outside perspective view of a lighting device of an integrated heat-dissipating apparatus according to prior art.
Figure 1B:
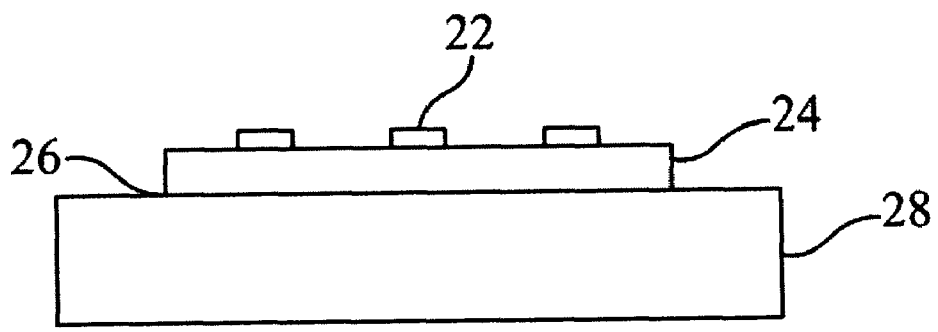
FIG. 1B is a sectional of the lighting device of the integrated heat-dissipating apparatus according to prior art.
Figure 2:
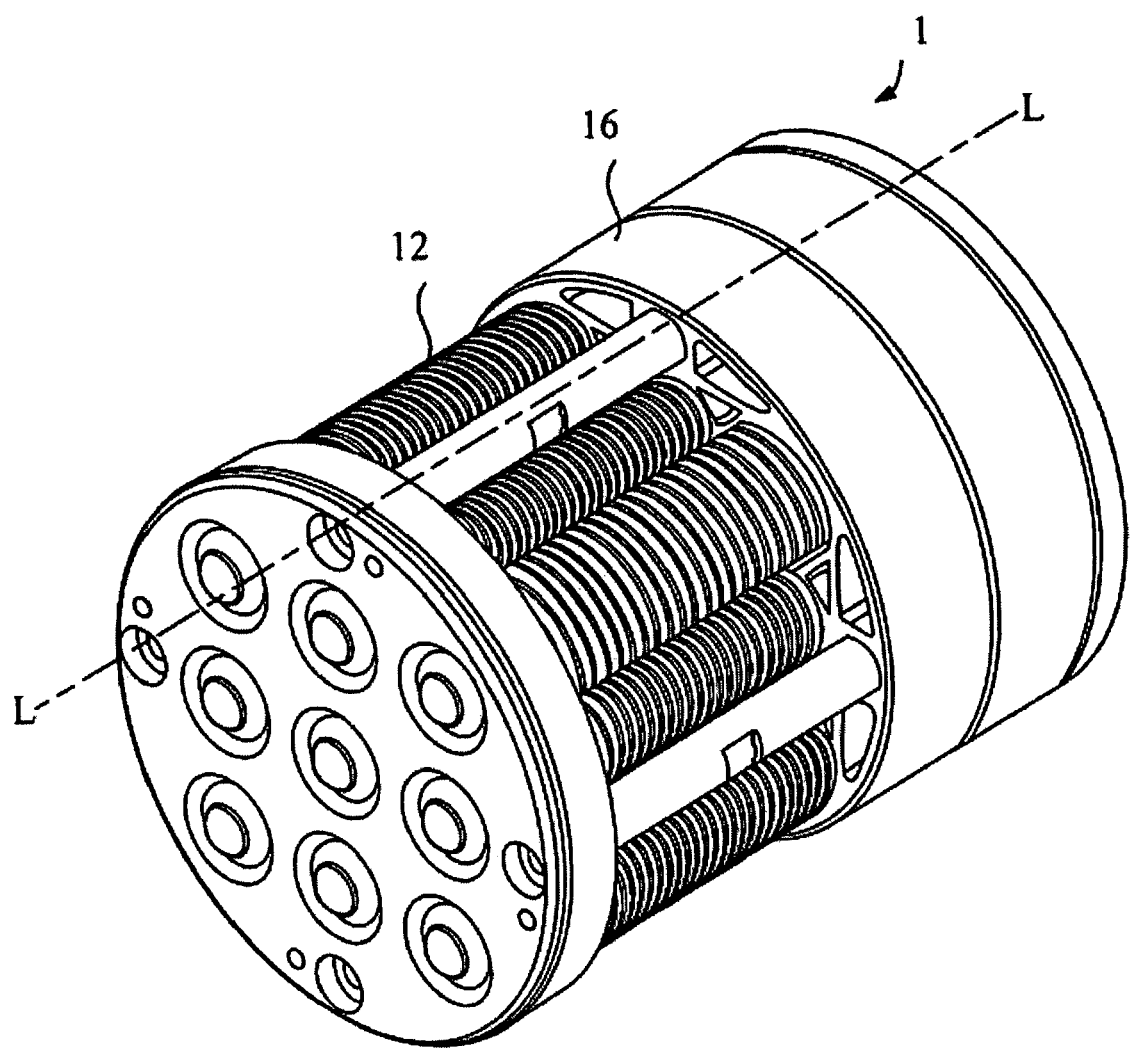
FIG. 2 is an outside perspective view of a light-emitting diode cluster lamp according to the invention.
Figure 3:
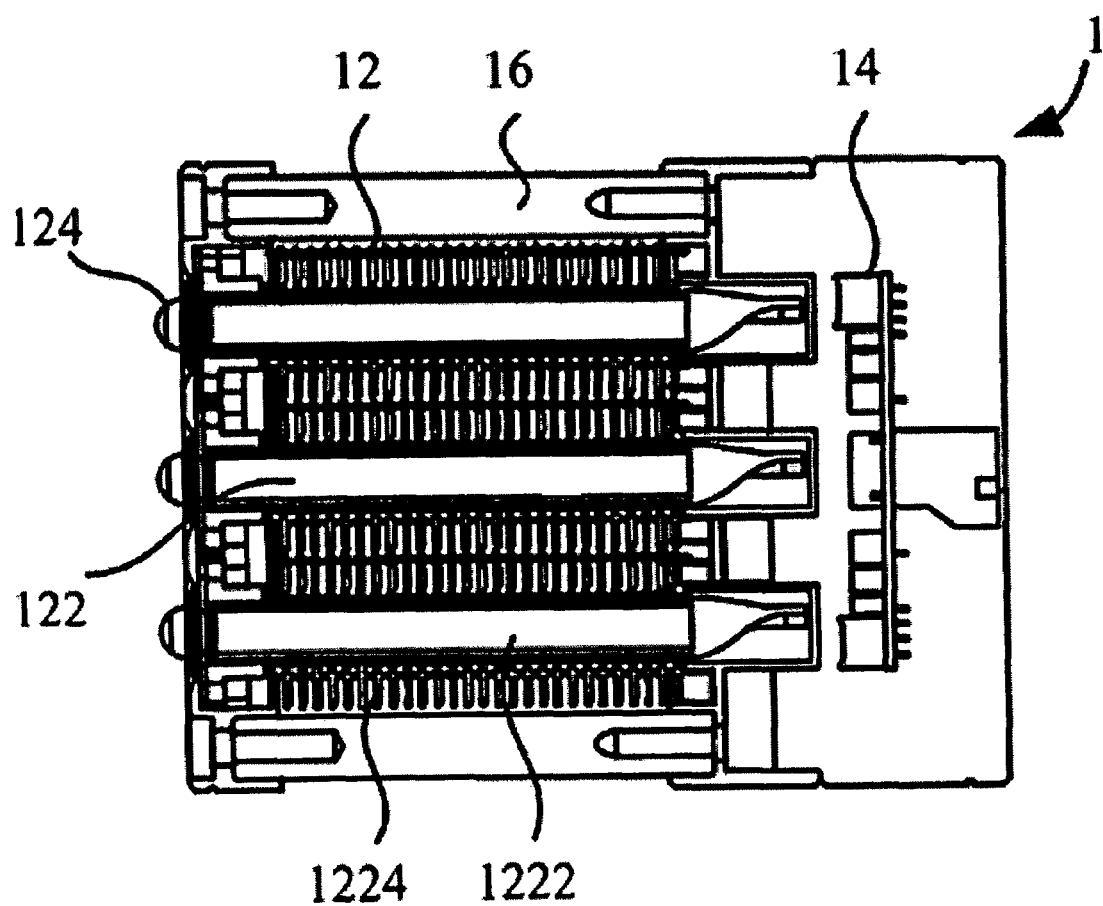
FIG. 3 is a cross-section along the L-L line of the light-emitting diode cluster lamp in the FIG. 2 according to the invention.

Referring to FIG. 2. and FIG. 3, FIG. 2 is an outside perspective view of the light-emitting diode cluster lamp according to the invention. FIG. 3 is a cross-section along the L-L line of the light-emitting diode cluster lamp in the FIG. 2 according to the invention. The light-emitting diode cluster lamp 1, according to the invention, includes a plurality of light-emitting diode lamp packages 12, a control circuit module 14, and a casing 16. In this embodiment of the invention, the diode lamp packages 12 are arranged into an array.

Each of the light-emitting diode lamp packages 12 includes a heat-conducting-and-dissipating module 122 and a light-emitting diode module 124. The heat-conducting-and-dissipating module 122 includes a heat-conducting device 1222 and at least one heat-dissipating fin 1224. The at least one heat-dissipating fin 1224 is mounted on a circumference of the heat-conducting device 1222 that has a flat portion. The light-emitting diode module 124 is disposed on the flat portion of the heat-conducting device 1222 and attached flatly and seamlessly to the flat portion. The light-emitting diode module 124 packs many light-emitting diodes or laser diodes together, so that each of the light-emitting diode modules 124 can provide a lighting-effect comparative to that of a point source. The control circuit module 14 is used for controlling the light-emitting diode lamp packages 12. The casing 16 is adapted to accommodate the light-emitting diode lamp packages 12 and the control circuit module 14.

When the light-emitting diode cluster lamp 1 is connected to a power source, the control circuit module 14 controls the light-emitting diode modules 124 and selectively makes the light-emitting diode modules 124 emit lights. Furthermore, the heat generated during light emission of one of the light-emitting diode modules 124 is conducted from the flat portion of the heat-conducting device 1222 corresponding to the one light-emitting diode module 124 to the at least one heat-dissipating fin 1224, and then the heat is dissipated by the at least one heat-dissipating fin 1224.

As shown in FIG. 3, the control circuit module 14 and the light-emitting diode modules 124, according to the invention, are located a distance away from each other, thus preventing the control circuit module 14 from being directly affected by the heat energy generated by the light-emitting diode modules 124.

Figure 4:
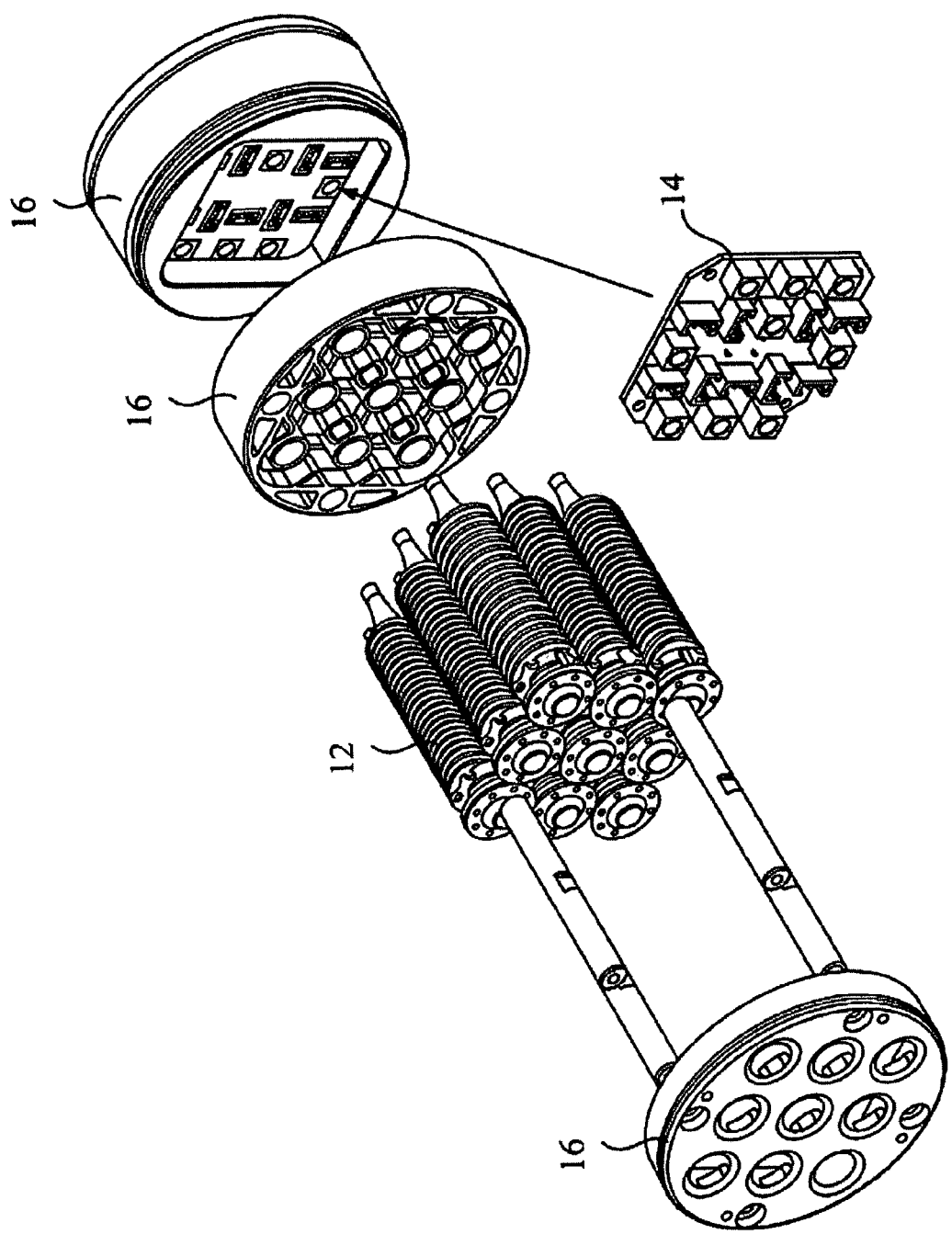
FIG. 4 is a blown-up perspective view of the light-emitting diode cluster lamp according to the invention.
Figure 5A:
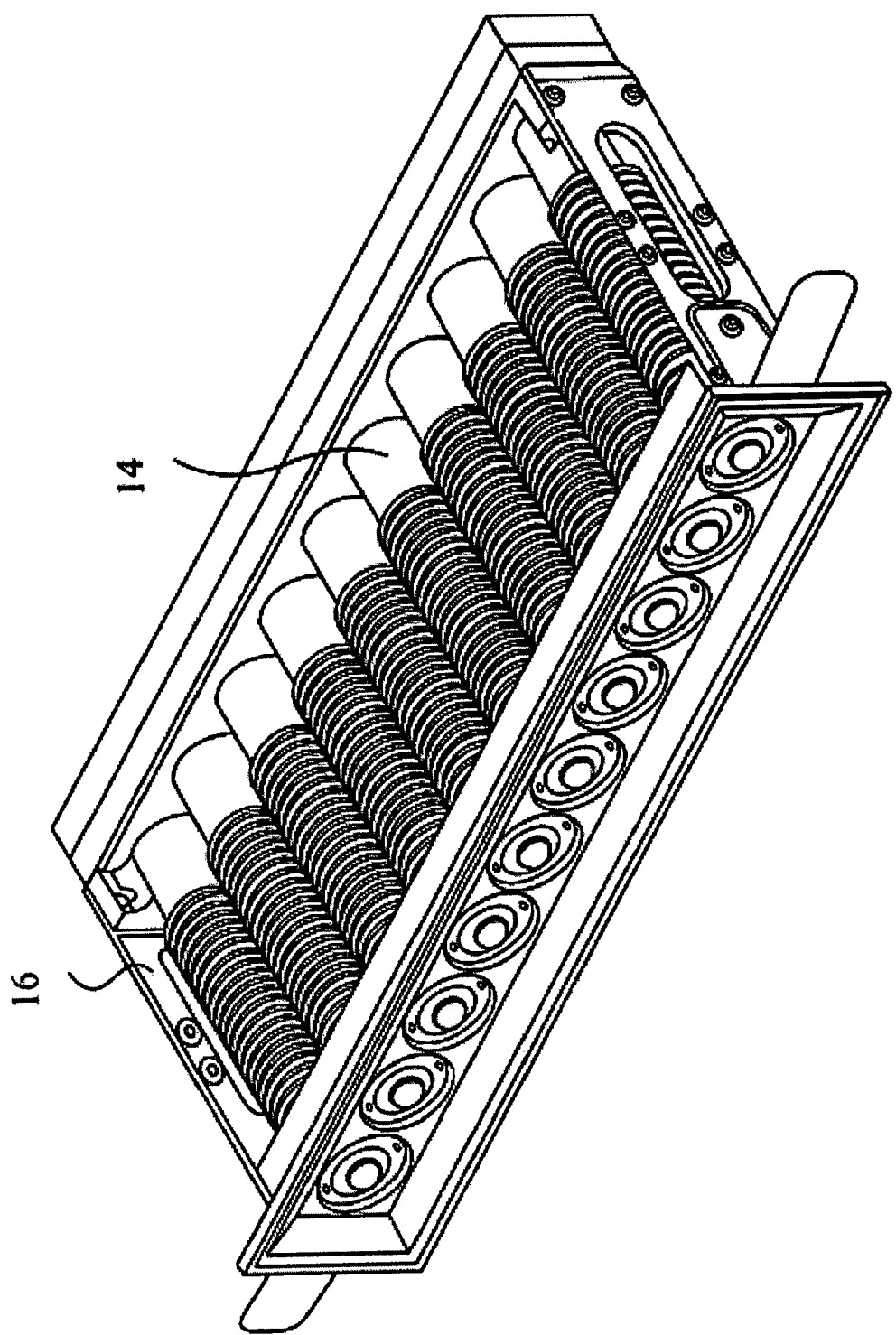
FIG. 5A and FIG. 5B are diagrams showing many specifications of the light-emitting diode cluster lamp according to the invention.
Figure 5B:
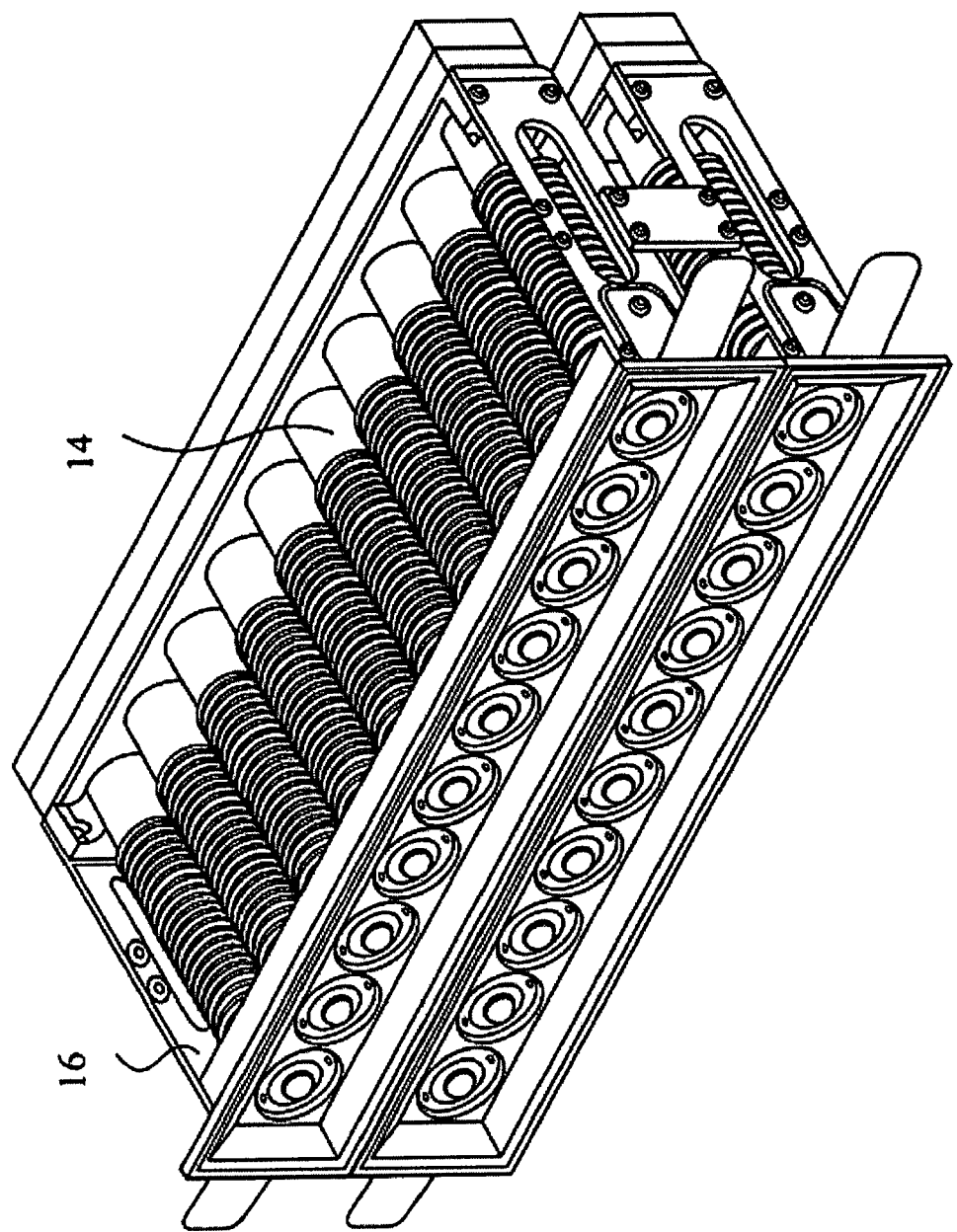

Referring to FIG. 4, FIG. 4 is a blown-up perspective view of the light-emitting diode cluster lamp according to the invention. Connections among different modules can be better understood through the figure. The light-emitting diode cluster lamp, according to the invention, is also capable of arranging the light-emitting diode lamp packages into a column. Referring to FIG. 5A and FIG. 5B, FIG. 5A and FIG. 5B are diagrams showing many specifications of the light-emitting diode cluster lamp according to the invention.

Figure 6:
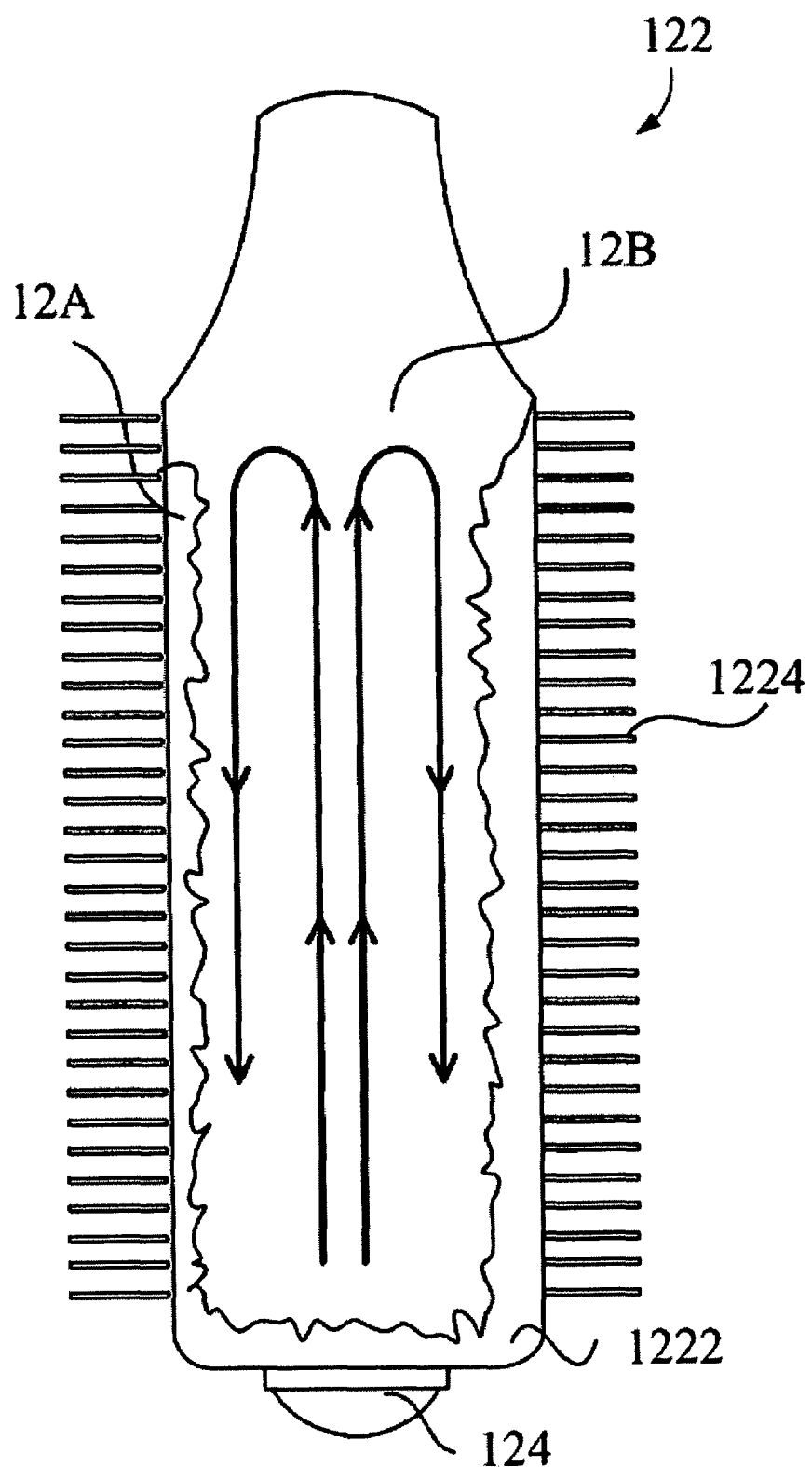
FIG. 6 is diagram illustrating the heat-conducting-and-dissipating mechanism of the light-emitting diode cluster lamp according to the invention.

In a practical application, the heat-conducting device is a heat pipe, a heat column, or a cylindrical device made from a material with high heat conductivity. Referring to FIG. 6, FIG. 6 is a diagram illustrating the heat-conducting-and-dissipating mechanism of the heat-conducting/dissipating module 122 according to the invention. The heat-conducting device 1222 inside the heat-conducting-and-dissipating module 122 includes a capillary structure 12A and a work fluid 12B. When the light-emitting diode module 124 generates heat, the work fluid 12B in the part of the heat-conducting device 1222 closer to the light-emitting diode module 124 evaporates into a gas. Gasified work fluid 12B can conduct heat to the other end of the heat-conducting device 1222, and the gasified work fluid 12B becomes re-liquified by condensation after the at least one dissipating fin 1224 dissipates the heat and cools the gasified work fluid 12B. The capillary structure 12A is used for transporting the re-liquified work fluid 12B back to the part of the heat-conducting device 1222 closer to one end of the light-emitting diode module 124. By using the circulating method illustrated in FIG. 5, heat conduction and dissipation can be achieved.

According to the invention, the power source connected to the light-emitting diode cluster lamp is an AC power source or a DC power source. When the power source is an AC power source, the control circuit module further includes an AC-to-DC converter for converting the AC power into the DC power, for use by the light-emitting diode cluster lamp.

In one embodiment of the invention, each of the light-emitting diode modules of the light-emitting diode cluster lamp includes a substrate, two electrodes, and a light-emitting module. The substrate is made from a semi-conductive material or a ceramic material. The light-emitting module and the two electrodes are respectively disposed on the substrate. The light-emitting module connects to the control circuit module through each of the electrodes.

In another embodiment of the invention, each of the light-emitting diode modules in the light-emitting diode cluster lamp includes a light-emitting module and two electrodes. The light-emitting module and the two electrodes are directly disposed on the flat portion of the heat-conducting device corresponding to the light-emitting diode module, and an insulator exits in between the two electrodes and the heat-conducting device.

In a practical application, the light-emitting module includes at least one light-emitting diode or laser diode. The light-emitting diode of the light-emitting module can be a white light diode or a white light diode made of a blue light diode and a phosphor. The light-emitting device can also include at least one red light diode, at least one blue light diode, and at least one green light diode. The control circuit module can selectively make the at least one red light diode, the at least one blue light diode, and the at least one green light diode emit lights, so that the light-emitting diodes with different colors can constitute lights with different colors by applying different proportions of light emissions.

Due to the fact that each of the light-emitting diode lamp packages of the light-emitting diode cluster lamp, according to the invention, packs many light-emitting diodes together; the light-emitting module has a relatively smaller volume compared with that of the concave mirror adapted for the light-emitting module and that of the entire diode lamp. Thus, each of the light-emitting diode lamp packages can provide a lighting effect comparative to that of a point source. The light-emitting diode cluster lamp, according to the invention, clusters the light-emitting diode lamp packages into an array or a column, so that lighting with high intensity or high brightness can be provided.

Meanwhile, due to the fact that the light-emitting cluster lamp, according to the invention, integrates the heat-conducting-and-dissipating module with the light-emitting diode module, the heat-conducting-and-dissipating module can immediately dissipate the heat energy generated by the light-emitting diode module to the surrounding air by using the at least one heat-dissipating fin, thus increasing the heat-dissipating efficiency substantially. By improving the heat-dissipating efficiency, the problem of decreased efficiency of the light-emitting diodes caused by overheating can be resolved. Therefore, the lighting efficiency of the light-emitting diode cluster lamp, according to the invention, has also increased compared with that according to prior art.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A light-emitting diode cluster lamp, comprising:
a plurality of light-emitting diode lamp packages, each of the light-emitting diode lamp packages comprising:
a heat-conducting and dissipating module, comprising:
a heat-conducting device having a chamber surrounded by a flat end portion and a cylindrical wall sealed to a peripheral of the flat end portion, wherein a capillary structure is formed on both the inner surface of the flat end portion and the inner surface of the cylindrical wall, a work fluid being distributed in the capillary structure and evaporated at the flat end portion; and
at least one heat-dissipating fin mounted on the circumference of the heat-conducting device; and
a light-emitting diode module disposed on the flat end portion of the heat-conducting device; and
a control circuit module for controlling the light-emitting diode lamp packages;
wherein when the light-emitting diode cluster lamp is connected to a power source, the control circuit module selectively controls the light-emitting diode modules to emit light, and the heat generated during light emission of one of the light-emitting diode modules is conducted from the flat end portion of the heat-conducting device corresponding to the one light-emitting diode module to the at least one heat-dissipating fin, and then dissipated by the at least one heat-dissipating fin, wherein each flat end portion of the heat-conducting device is substantially parallel to each other such that the direction of the major portion of the light generated from each light-emitting diode module is substantially parallel to each other.

2. The light-emitting diode cluster lamp of claim 1, further comprising a casing adapted to accommodate the light-emitting diode lamp packages and the control circuit module.

3. The light-emitting diode cluster lamp of claim 1, wherein each heat-conducting device of the heat-conducting and dissipating devices is a heat pipe, a heat column, or a cylindrical device made from a material with high heat conductivity.

4. The light-emitting diode cluster lamp of claim 1, wherein each of the light-emitting diode modules comprises a substrate, a light-emitting module, and two electrodes; the light-emitting module and the two electrodes are respectively disposed on the substrate.

5. The light-emitting diode cluster lamp of claim 1, wherein each of the light-emitting diode modules comprises a light-emitting module and two electrodes, the light-emitting module and the two electrodes are respectively disposed on the flat portion of the heat-conducting device corresponding to the light-emitting diode module, and an insulator exists in-between the two electrodes and the heat-conducting device.

6. The light-emitting diode cluster lamp of claim 4, wherein light-emitting module of each of the light-emitting diode modules comprises at least one light-emitting diode or a laser diode.

7. The light-emitting diode cluster lamp of claim 6, wherein the light-emitting diode of the light-emitting module is a white light diode.

8. The light-emitting diode cluster lamp of claim 7, wherein the white light diode comprises a blue light diode and a phosphor.

9. The light-emitting diode cluster lamp of claim 4, wherein the light-emitting module of each light-emitting diode module comprises at least one red light diode, at least one blue light diode, and at least one green light diode.

10. The light-emitting diode cluster lamp of claim 9, wherein the control circuit module selectively makes the at least one red light diode, the at least one blue light diode, and the at least one green light diode in each of the light-emitting module emit lights.

11. The light-emitting diode cluster lamp of claim 1, wherein the power source is an AC power source, and the control circuit further comprises an AC-to-DC converter.

12. The light-emitting diode cluster lamp of claim 1, wherein the light-emitting diode lamp packages are arranged into an array.

13. The light-emitting diode cluster lamp of claim 1, wherein the light-emitting diode lamp packages are arranged into a column.

* * * * *